United States Patent
Hara et al.

(10) Patent No.: US 9,245,829 B2
(45) Date of Patent: Jan. 26, 2016

(54) SUBSTRATE STRUCTURE, METHOD OF MOUNTING SEMICONDUCTOR CHIP, AND SOLID STATE RELAY

(71) Applicant: OMRON Corporation, Kyoto-shi, Kyoto (JP)

(72) Inventors: Shintaro Hara, Takeo (JP); Shoichi Konagata, Shenzhen-shi (CN); Yuzo Iwasaki, Takeo (JP); Tomonori Shiraishi, Saga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 13/949,206

(22) Filed: Jul. 23, 2013

(65) Prior Publication Data

US 2014/0077375 A1    Mar. 20, 2014

(30) Foreign Application Priority Data

Sep. 14, 2012    (JP) ................ 2012-203236

(51) Int. Cl.
| | | |
|---|---|---|
| H01L 23/48 | (2006.01) | |
| H01L 23/492 | (2006.01) | |
| H01L 23/00 | (2006.01) | |
| H05K 1/11 | (2006.01) | |

(Continued)

(52) U.S. Cl.
CPC ............. *H01L 23/492* (2013.01); *H01L 23/13* (2013.01); *H01L 24/80* (2013.01); *H01L 24/83* (2013.01); *H05K 1/111* (2013.01); *H01L 24/29* (2013.01); *H01L 24/32* (2013.01); *H01L 2224/26175* (2013.01); *H01L 2224/291* (2013.01); *H01L 2224/29007* (2013.01); *H01L 2224/29036* (2013.01); *H01L 2224/32245* (2013.01); *H01L 2224/73271* (2013.01); *H01L 2224/83192* (2013.01); *H01L 2224/83815* (2013.01); *H01L 2924/13033* (2013.01); *H01L 2924/15747* (2013.01); *H05K 3/3431* (2013.01); *H05K 2201/09745* (2013.01);

(Continued)

(58) Field of Classification Search
CPC .................. H01L 23/492; H01L 24/80; H01L 2924/13033; H01L 2924/00; H01L 2924/0105; H01L 2924/01047; H01L 2924/0133; H01L 23/13; H05K 1/111; H05K 2201/09745; H05K 2201/1031; H05K 2201/10053; H05K 2201/1301; H05K 2201/10318; H05K 3/3431
USPC .................. 257/741, 783, 779, 738, E27.001, 257/E27.004, E25.01, E27.01; 361/54, 118, 361/93.1, 18, 56, 115, 824, 819, 820
See application file for complete search history.

(56) References Cited

U.S. PATENT DOCUMENTS

| | | | | |
|---|---|---|---|---|
| 6,121,689 A | * | 9/2000 | Capote ................ | B23K 35/025 257/773 |
| 6,249,053 B1 | * | 6/2001 | Nakata ................ | H01L 21/4853 257/738 |

(Continued)

FOREIGN PATENT DOCUMENTS

| | | |
|---|---|---|
| EP | 1 986 478 A2 | 10/2008 |
| JP | 2000-307224 A | 11/2000 |

*Primary Examiner* — Yosef Gebreyesus
(74) *Attorney, Agent, or Firm* — Klarquist Sparkman, LLP

(57) ABSTRACT

This invention provides a substrate structure that can effectively prevent scattering of solder balls which are produced due to explosion attributable to evaporation of flux during reflow soldering, and spreading of molten solder to the surroundings. On a substrate, a semiconductor chip is mounted via solder paste. The substrate is provided with a groove portion which continuously or discontinuously surrounds the solder paste.

16 Claims, 7 Drawing Sheets

(51) Int. Cl.
*H01L 23/13* (2006.01)
*H05K 3/34* (2006.01)

(52) U.S. Cl.
CPC ............ *H05K 2201/1031* (2013.01); *H05K 2201/10053* (2013.01); *H05K 2201/10318* (2013.01)

(56) References Cited

U.S. PATENT DOCUMENTS

| | | |
|---|---|---|
| 2002/0071935 A1* | 6/2002 | Wu .................................. 428/134 |
| 2003/0073349 A1 | 4/2003 | Nagao et al. |
| 2005/0051885 A1* | 3/2005 | Weng .................... H01L 21/563 257/687 |
| 2007/0026575 A1* | 2/2007 | Subramanian ........ H01L 21/563 438/127 |
| 2007/0297145 A1* | 12/2007 | Karrer et al. ................... 361/720 |
| 2008/0023829 A1* | 1/2008 | Kok et al. ...................... 257/737 |
| 2008/0122083 A1* | 5/2008 | Park et al. ...................... 257/737 |
| 2013/0327563 A1* | 12/2013 | Kitagawa ............... H05K 1/116 174/257 |
| 2014/0061903 A1* | 3/2014 | Chen ...................... H01L 24/29 257/738 |

* cited by examiner

SUBSTRATE STRUCTURE, METHOD OF MOUNTING SEMICONDUCTOR CHIP, AND SOLID STATE RELAY

CROSS REFERENCE TO RELATED APPLICATION

This application claims benefit of priority to Japanese Patent Application No. 2012-203236 filed on 14 Sep. 2012 of which full contents are added by herein.

The present invention relates to a substrate structure to be used for reflow soldering.

BACKGROUND OF THE INVENTION

When mounting a semiconductor chip on a substrate using a reflow soldering method, solder paste is used. When an amount of printed solder paste is excessive or when a force of pushing a semiconductor chip is excessively strong, the solder paste overflows from a soldered surface of the semiconductor chip and is subjected to reflow heating. This leads to formation of solder balls or uncontrollable spreading of molten solder paste to a flow area.

To deal with solder ball formation and uncontrollable spreading of molten solder paste to the flow area, conventionally, a buildup layer via-hole is provided so as to be connected to a pad on a printed circuit board, and a portion of copper plating inside the via-hole is removed to partially expose resin which is formed underneath the copper plating. This leads to forming of a via-hole inner wall portion where the resin is partially exposed. One such implementation is disclosed in Japanese Unexamined Patent Publication No. 2000-307224. In accordance with this configuration, the solder paste that overflows from the pad first, collects in the via-hole, and the molten solder in the via-hole is supplied to a necessary area at the time of reflow heating, and further the surplus solder gravitates toward the remaining conductor inside the via-hole.

However, since the conventional substrate structure is constructed so that the molten solder is drained to the inside of the via-hole which is a closed space, there is a fear that flux evaporates and increases pressure in the closed space, which causes explosion. As a result, there is also a possibility that solder balls scatter circumferentially and the semiconductor chip cannot be mounted in a desired state.

Furthermore, the conventional substrate structure is only for use in printed circuit boards, and cannot be used for a substrate where a semiconductor chip is mounted in a state in which the whole bottom surface of the semiconductor chip is in area contact with a copper plate formed in an upper surface of a substrate via solder paste. For this reason, there is no space to form a via-hole at all in the substrate.

SUMMARY OF THE INVENTION

The object of the invention is to provide a substrate structure to be used during reflow soldering.

In accordance with one aspect of the present invention, a substrate structure is configured to mount a semiconductor chip on a substrate by using a solder paste, the substrate includes a groove portion continuously or discontinuously surrounds the solder paste.

The groove portion is preferably formed within an area occupied by the semiconductor chip to be mounted.

In an alternate embodiment, The groove portion is preferably formed so that the width of an opening of the groove portion in a surface of the substrate is larger than a depth of the groove portion.

The groove portion may have a depth equal to or less than ½ of a thickness of the substrate.

The groove portion is preferably formed so that a total volume of the groove portion within the substrate is larger than a volume of flux to be evaporated when the solder paste melts.

In one embodiment of the substrate structure, the groove portion is preferably formed so that a volume of a portion of the groove portion, corresponding to a corner of the semiconductor chip to be mounted is larger than any other portions.

In one embodiment, the substrate is a DCB substrate (Direct Copper Bonding substrate) or a DBC substrate (Direct Bonding Copper substrate).

In accordance with another aspect of the present invention, a method of mounting a semiconductor chip includes obtaining a mounting area by forming a groove portion, configuring the mounting area to continuously or discontinuously surround a predetermined area in the substrate, applying solder paste to a mounting area of the substrate, arranging the semiconductor chip on the solder paste, and bonding the semiconductor chip to the substrate using a reflow soldering process.

DETAILED DESCRIPTION

Hereinafter, embodiments of the present invention will be described with reference to the accompanying drawings. Moreover, terms (for example, terms including "upper," "lower," "side," and "end.") expressing specific directions and positions are used if necessary in the following description, but these terms are used only for an easy understanding of the present invention that is described with reference to the drawings and the meanings of these terms do not limit a technical scope of the present invention. Furthermore, the following description is only an example in nature, and is not intended to limit the present invention, applications thereof, or uses thereof.

Figure 1:
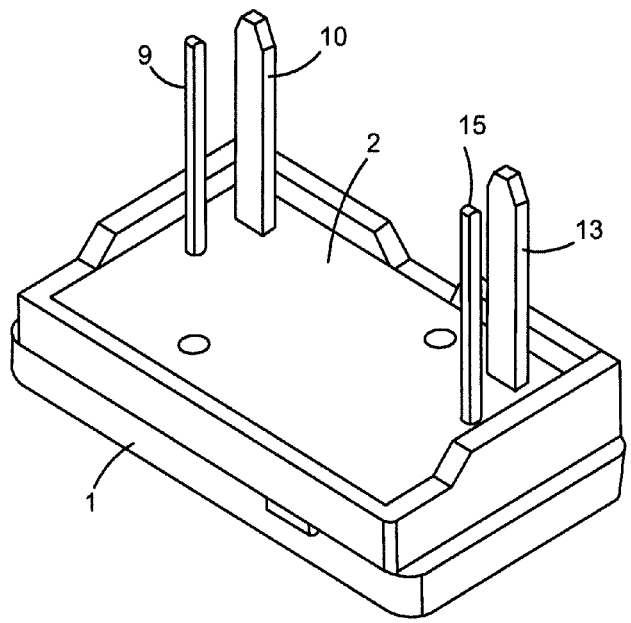
FIG. 1 is a perspective view illustrating a state in which a solid state relay according to one embodiment is viewed from the bottom side.

FIG. 1 is a perspective view of a state in which an electronic device (solid state relay) incorporating therein a substrate 3 having a substrate structure according to the present embodiment is viewed from the bottom. FIG. 1 illustrates a casing 1 of an approximately rectangular parallelepiped which is open in the bottom surface (upper surface in the drawing), a plate-like base 2 which closes the bottom of the casing 1, and four terminals (signal terminals 9 and 15 and power terminals 10 and 13) protruding from the base 2.

Figure 2:
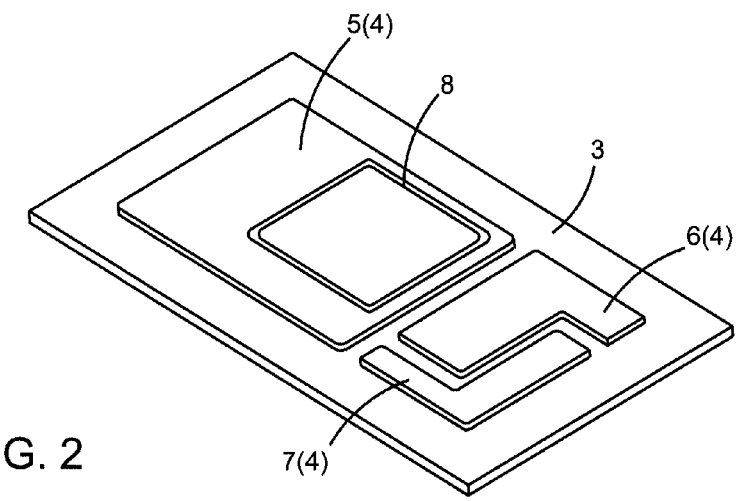
FIG. 2 is a perspective view of a substrate which is embedded in the solid state relay of FIG. 1.

As illustrated in FIG. 2, the substrate 3 is accommodated in the casing 1. A DCB substrate (Direct Copper Bonding substrate) or a DBC substrate (Direct Bonding Copper substrate) is used as the substrate 3. A copper plate is directly joined with an upper surface of the substrate so as to form a conductive portion 4. The conductive portion 4 includes a first conductive portion 5, a second conductive portion 6, and a third conductive portion 7.

Figure 3:
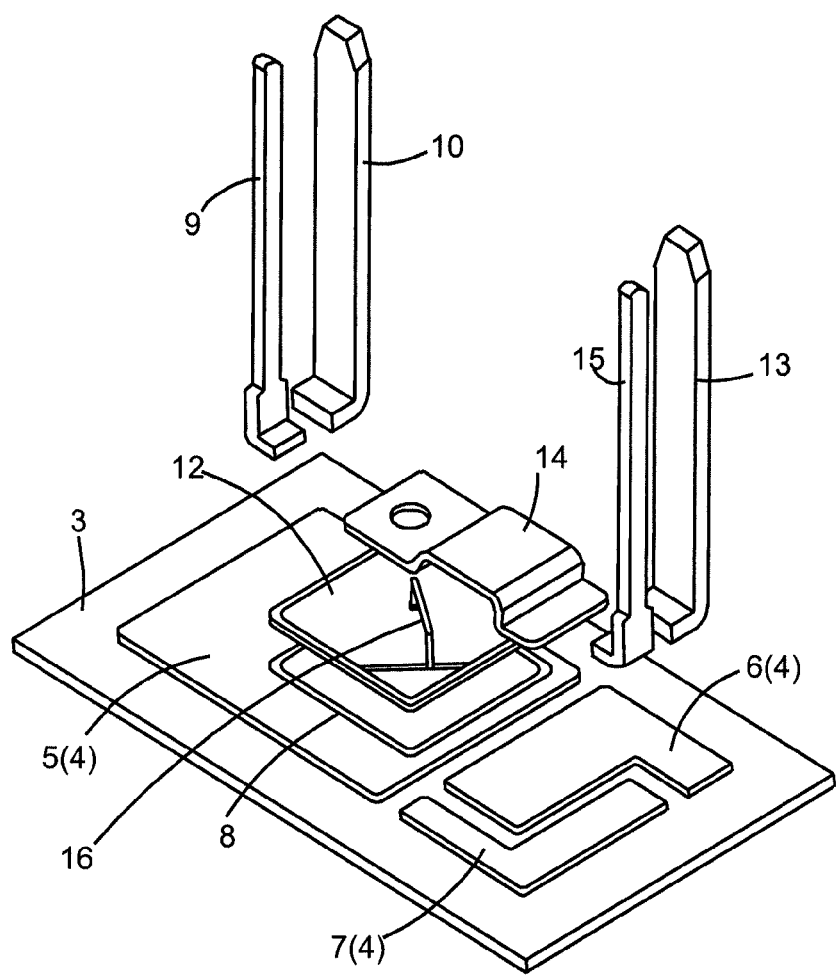
FIG. 3 is an exploded perspective view of the substrate which is embedded in the solid state relay of FIG. 1.
Figure 4:
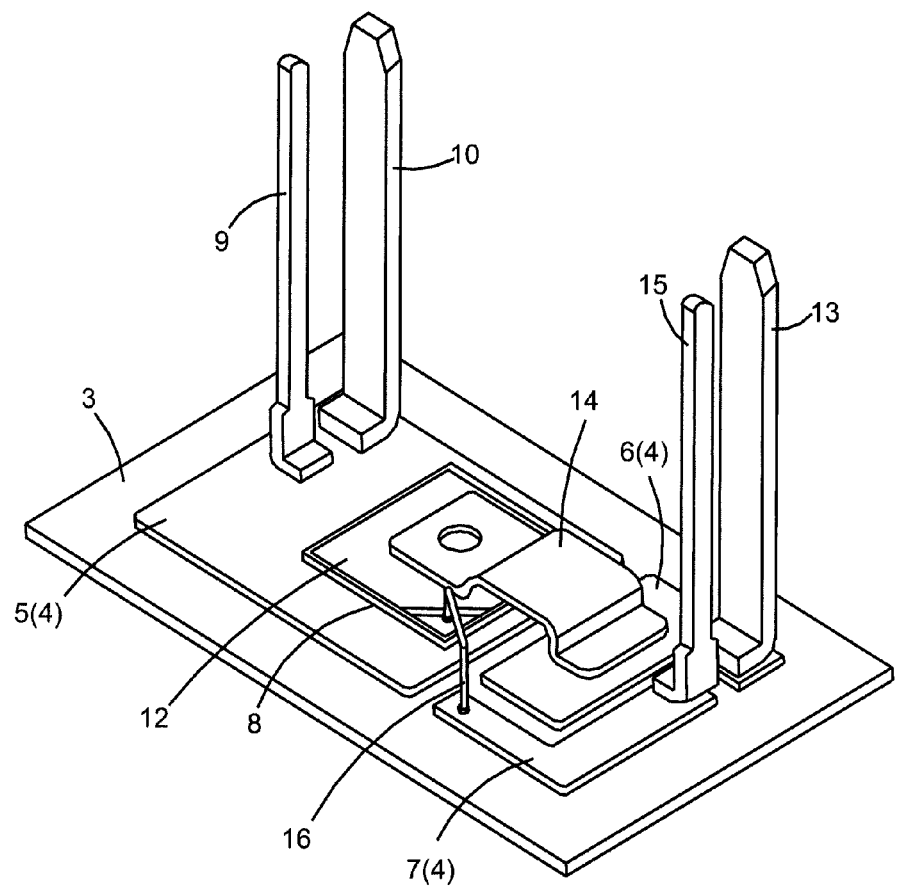
FIG. 4 is a perspective view showing a state after the substrate which is embedded in the solid straight relay of FIG. 1 is assembled.

The first conductive portion 5 has a rectangular shape in a plan view, has a rectangular groove portion 8 in an upper surface thereof, and as illustrated in FIG. 3, is connected to the first signal terminal 9 and the first power terminal 10. A Solder paste 11 (refer to FIG. 5A) is applied to an area surrounded by the groove portion 8 using a printing method.

Figure 5A:
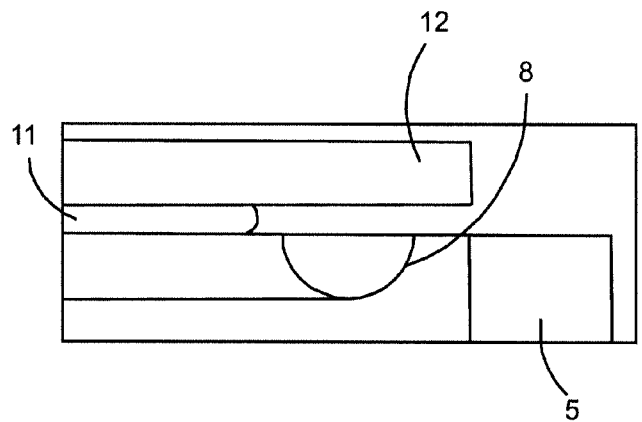
FIG. 5A is a schematic cross-sectional views of a substrate and a copper plate, illustrating a state before solder paste of FIG. 4 starts melting.

As illustrated in FIG. 5A, the groove portion 8 is formed along an outer edge of the mounted semiconductor chip 12, and in a position inside the outer edge of the semiconductor chip 12. The groove portion 8 has a semicircular cross-section, and has a depth which is equal to or less than a half of a thickness of the copper plate which constitutes the first conductive portion 5. This leads to expansion of solder attributable to evaporation of flux, and thus flow of molten solder can be prevented while a decrease in an electric capacitance of a copper plate portion can be suppressed. A total volume of the groove portion 8 within the substrate 3 is preferably larger than a volume of flux 11a which evaporates while the semiconductor chip 12 is being soldered onto the solder paste 11 as described below. Even though the flux evaporates and the volume of solder increases, since expansion of the volume of solder can be buffered, production of solder balls and scattering of the solder balls to surroundings which are attributable to explosion can be surely prevented. Therefore, problems such as a short circuit attributable to the spattered solder balls can be surely prevented Furthermore, the groove portion 8 preferably has a volume at which the molten solder paste 11 can be retained and the flow of molten solder to the outside of the groove portion 8 can be prevented.

The semiconductor chip 12 is placed on the solder paste 11. The semiconductor chip 12 is a conventionally known semiconductor chip and is configured such that when a voltage is applied from both input terminals, a photo diode embedded therein emits light, a triac switch turns on, and an electric current flows between output terminals. The first power terminal 10 is connected to one input terminal, and the second power terminal 13 is connected to the other input terminal. The first signal terminal 9 is connected to one output terminal, and the second signal terminal 15 is connected to the other output terminal.

The second power terminal 13 and an electrode body 14 are connected to the second conductive portion 6. The electrode body 14 is also connected to the input terminal on one side of the semiconductor chip 12 so that the semiconductor chip 12 can be applied with a voltage. The second signal terminal 15 is connected to the third conductive portion 7. The third conductive portion 7 and the input terminal on the other side are connected to each other via a signal line 16.

Next, a method of manufacturing a solid state relay constructed in the way described above is described. A groove portion 8 of a rectangular shape is formed in a first conductive portion 5 of the substrate 3. Then, solder paste 11 is applied to an area surrounded by the groove portion 8 using a printing method. Then, the semiconductor chip 12 is placed on the applied solder paste 11. Each terminal is placed on a conductive portion 4 via the solder paste 11, signal lines 16 are connected, and the connection is performed through reflow soldering.

Figure 5B:
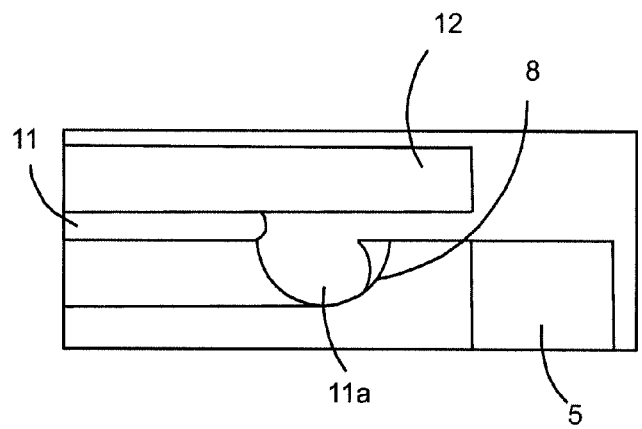
FIG. 5B is a schematic cross-sectional views of a substrate and a copper plate, illustrating a after melting is started.

During the reflow soldering, the solder paste 11 between the substrate 3 and the semiconductor chip 12 melts and flux evaporates. In this case, there is a fear that flux, which evaporates, increases pressure in a narrow space between the substrate 3 and the semiconductor chip 12, causing explosion and producing solder balls. However, since the groove portion 8 is formed, a sufficiently large space is provided. Therefore, as illustrated in FIG. 5B, a phenomenon that the pressure in this area is increased by the evaporated flux is appropriately prevented, and therefore there is no fear that solder balls are produced by explosion.

For example, by setting a volume of the space in the groove portion 8 to be larger than a volume of the flux 11a that evaporates, production of solder balls attributable to explosion can be surely prevented.

Figure 5C:
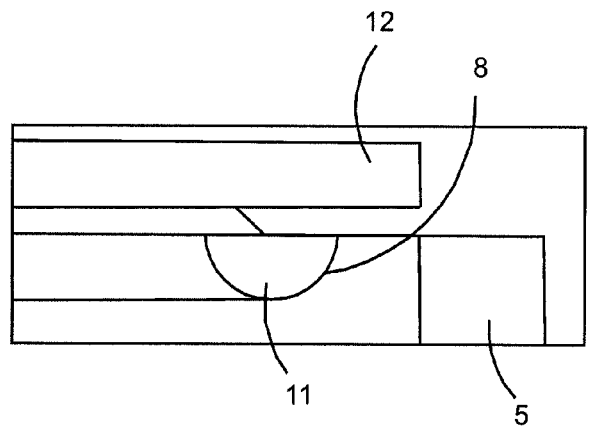
FIG. 5C is a schematic cross-sectional views of a substrate and a copper plate, a state in which melting is completed.

Furthermore, a volume of the space in the groove portion 8 is preferably a volume at which the solder paste 11 which is melted can be retained so as to prevent the solder paste 11 from flowing outside beyond the groove portion. In this case, as illustrated in FIG. 5C, the groove portion 8 prevents the molten solder paste 11 from spreading to the surroundings thereof. That is, the area occupied by the solder paste 11 is restricted to be within the area surrounded by the groove portion 8. As a result, a mounting position of the semiconductor chip 12 is not changed by melting of the solder paste 11, and the semiconductor chip 12 can be mounted in a desired position.

When the groove portion 8 is formed along with an outer edge of the semiconductor chip 12 placed on the substrate 3 and a portion of the groove portion 8 is formed inside the outer edge of the semiconductor chip 12, it is possible to surely prevent the molten solder from spreading to the outside of a mounting area of the semiconductor chip 12. Particularly when a position of an outer edge of the groove portion 8 is located inside a position of the outer edge of the semiconductor chip 12, it is possible to prevent a short circuit attributable to solder adhering to a side surface of the semiconductor chip 12. Hence, the alignment of the semiconductor chip can be more accurately performed.

Furthermore, when the groove portion 8 has a semicircular cross section, a width of an opening of the groove portion 8 in the surface of the substrate 3 is allowed to be larger than a depth of the groove portion 8. With this configuration, since the molten solder can be smoothly flown into the groove portion, it is possible to secure a sufficient space volume of the groove portion 8, thereby surely preventing the flow of the molten solder. In addition, since there is no need to secure a large depth of the groove portion 8, it is possible to suppress the electric capacitance of the copper plate portion from decreasing. Still furthermore, when the depth of the groove portion 8 is equal to or less than a half of the thickness of the copper plate that constitutes the first conductive portion 5, it is possible to increase the space volume of the groove portion 8 while suppressing a decrease in the electric capacitance of the copper plate portion.

Furthermore, the present invention is not limited to the configurations of the embodiments described above, and various modifications thereto are possible.

Figure 6A:
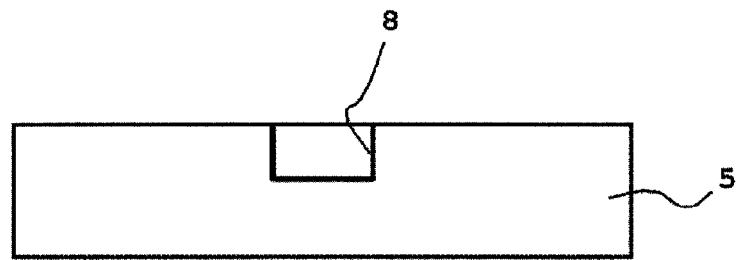
FIGS. 6A to 6D are partial cross-sectional views each showing a copper plate portion of a substrate according to another embodiment.
Figure 6B:
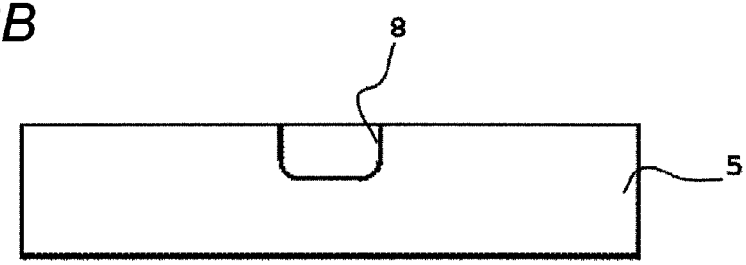
Figure 6C:
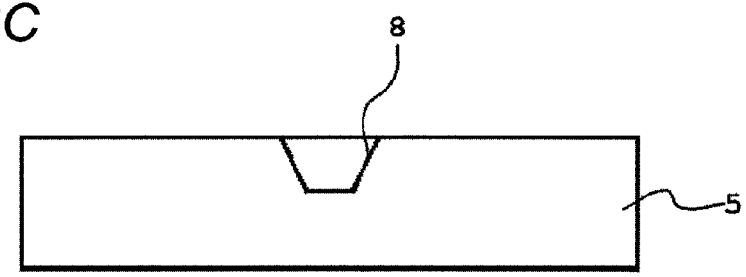
Figure 6D:
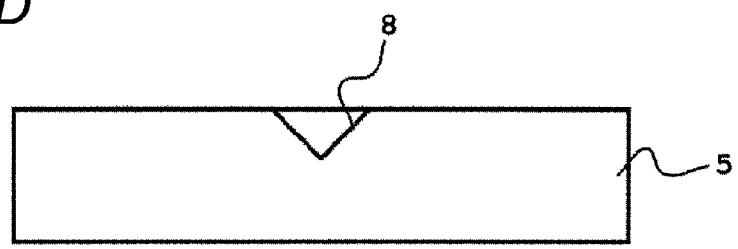

For example, although the sectional shape of the groove portion 8 is a semicircular shape in the embodiment described above, it is not limited to such a shape. That is, as illustrated in FIGS. 6A to 6D, various shapes can be adopted. In FIG. 6A, an upper portion and a lower portion have the same width. In FIG. 6B, the upper portion and the lower portion have the same width and edges of the bottom are rounded to have a circular-arc shape (R). In FIG. 6C, the groove portion has a cross section of a trapezoidal shape where an area of an opening gradually increases as it approaches the upper surface. In FIG. 6D, the groove portion has a cross section of an almost triangular shape where the area of the opening gradually increases as it approaches the upper surface.

In addition, although the groove portion 8 is formed in a rectangular shape which conforms the outer edge of the semiconductor chip 12, but the shape of the groove portion 8 needs not be limited thereto. The shapes illustrated in FIGS. 7A to 7E can be adopted.

Figure 7A:
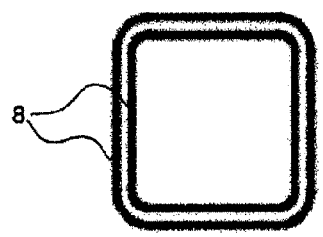
FIGS. 7A to 7E are plan views each showing an example of a pattern of a groove portion (with no discontinuity) formed in a copper plate portion of a substrate according to another embodiment.
Figure 7B:
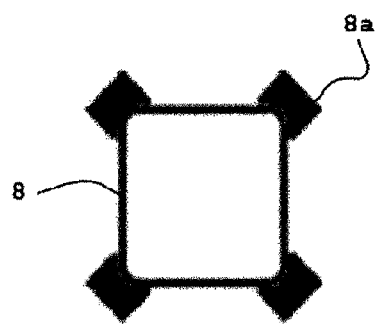
Figure 7C:
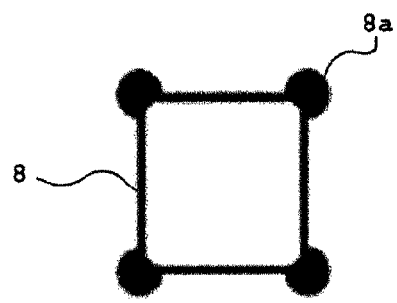
Figure 7D:
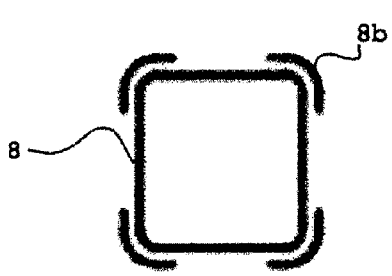
Figure 7E:
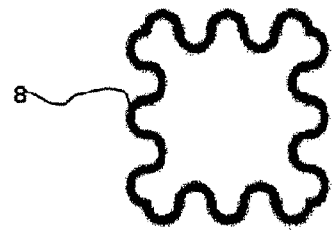

In FIG. 7A, the groove portion 8 has a double structure. The groove portion 8 can also have a triple structure. In FIGS. 7B and 7C, expanded portions 8a having a larger volume are formed in corners of the groove portion 8. FIG. 7B illustrates the expanded portion of a rectangular shape and FIG. 7D illustrates the expanded portion of a circular shape. In FIG. 7D, auxiliary groove portions 8b are additionally formed outside corners of the groove portion 8, respectively. According to FIGS. 7B to 7D, the volume of the groove portion 8 is increased in a portion on which the molten solder tends to easily collect. Accordingly, these examples are advantageous in a point that it is possible to more surely prevent solder from spreading to the surroundings. In FIG. 7E, the groove portion 8 does not have linear sides but has meandering sides. These meandering sides need not be regular in pattern. Various patterns like a pattern in which large curves and small curves are alternately arranged, a pattern made up of zigzag lines, etc. can be adopted. According to FIG. 7E and its similar configurations, it is possible to increase the volume of the groove portion 8 per unit area, and hence an effect of retaining molten solder can be exhibited.

Figure 8A:
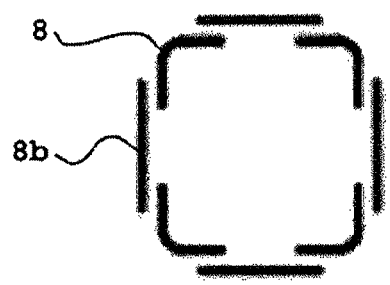
FIGS. 8A to 8C are plan views each showing an example of a pattern of a groove portion (with discontinuity) formed in a copper plate portion of a substrate according to still another embodiment.
Figure 8B:
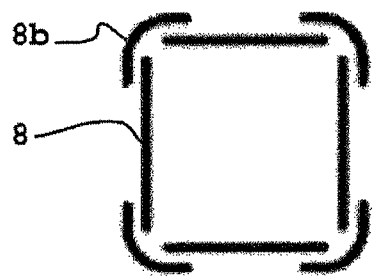
Figure 8C:
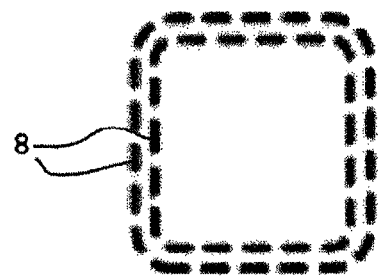

The groove portion 8 is not necessarily be formed in a continuous closed shape although the groove portions 8 of the examples have a continuous closed shape without any discontinuity. As illustrated in FIGS. 8A to 8C, the groove portion 8 may have a discontinuous shape.

In FIG. 8A, each of four sides of the groove portion 8 has discontinuity in the middle and the auxiliary groove portions 8b of a straight line shape are formed outside position of discontinuity of the groove portion 8, respectively. In FIG. 8B, there is discontinuity in each of four corners of the groove portion 8 and the auxiliary groove portions 8b of an arc shape are formed outside positions of the discontinuity of the groove portion 8, respectively. In FIG. 8C, the groove portion 8 is formed with a double dotted line including an inside dotted line and an outside dotted line.

Thus, even using the groove portion 8 having discontinuity, the flow of the molten solder can be prevented by the auxiliary groove portions 8b, etc.

As per the current invention, even though the solder melts during the reflow soldering and the flux evaporates, since the groove portion functions to increase a space volume, the space may not experience high pressure which leads to the explosion. Accordingly, scattering of the solder balls can be surely prevented. Furthermore, when the molten solder tries to spread into surroundings, the molten solder flows into the groove portion, and the flow of the molten solder beyond the groove portion is prevented. Therefore, the misalignment of the semiconductor chip to be mounted is prevented and the semiconductor can be guided to a desired position.

There has thus been shown and described substrate structure and solid state relay which fulfills all the objects and advantages sought therefore. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A substrate structure comprising:
   a substrate;
   a groove portion formed in said substrate for surrounding an area to which a solder paste is applied, said solder paste for mounting a semiconductor device,
   wherein the groove portion is formed along an outer edge of the mounted semiconductor device when said semiconductor device is placed on the substrate and a portion of the groove portion is formed inside the outer edge of the semiconductor device when said semiconductor device is placed on the substrate, said groove portion being configured to retain molten solder to prevent the molten solder from spreading to an area outside a mounting area of the semiconductor device when the solder paste melts.

2. The substrate structure according to claim 1, wherein the groove portion is formed within an area of the substrate to be occupied by the semiconductor device.

3. The substrate structure according to claim 2, wherein the groove portion has a depth equal to or less than ½ of a thickness of the substrate.

4. The substrate structure according to claim 2, wherein a width of an opening in a surface of the substrate is larger than a depth of the groove portion.

5. The substrate structure according to claim 4, wherein the groove portion has a depth equal to or less than ½ of a thickness of the substrate.

6. The substrate structure according to claim 1, wherein the groove portion has a depth equal to or less than ½ of a thickness of the substrate.

7. The substrate structure according to claim 1, wherein a total volume of the groove portion in the substrate is larger than a volume of flux to be evaporated when the solder paste melts.

8. The substrate structure according to claim 1, wherein a volume of a portion of the groove portion which corresponds to a corner of the semiconductor device to be mounted is larger than any other portions.

9. The substrate structure according to claim 1, wherein the substrate is a Direct Copper Bonding substrate or a Direct Bonding Copper substrate.

10. A solid state relay having an embedded substrate structure comprising:
   a substrate;
   a groove portion formed in said substrate for surrounding an area to which a solder paste is applied, said solder paste for mounting a semiconductor device,
   wherein the groove portion is formed along an outer edge of the mounted semiconductor device when said semiconductor device is placed on the substrate and a portion of the groove portion is formed inside the outer edge of the semiconductor device when said semiconductor device is placed on the substrate, said groove portion being configured to retain molten solder to prevent the molten solder from spreading to an area outside a mounting area of the semiconductor device when the solder paste melts.

11. The solid state relay according to claim 10, wherein the groove portion is formed within an area of the substrate to be occupied by the semiconductor device.

12. The solid state relay according to claim 11, wherein the groove portion has a depth equal to or less than ½ of a thickness of the substrate.

13. The solid state relay according to claim 11, wherein a width of an opening in a surface of the substrate is larger than a depth of the groove portion.

14. The solid state relay according to claim 13, wherein the groove portion has a depth equal to or less than ½ of a thickness of the substrate.

15. The solid state relay according to claim 11, wherein the groove portion has a depth equal to or less than ½ of a thickness of the substrate.

16. The solid state relay according to claim 10, wherein a total volume of the groove portion in the substrate is larger than a volume of flux to be evaporated when the solder paste melts.

* * * * *